United States Patent [19]
Amai et al.

[11] Patent Number: 5,096,839
[45] Date of Patent: Mar. 17, 1992

[54] SILICON WAFER WITH DEFINED INTERSTITIAL OXYGEN CONCENTRATION

[75] Inventors: Tsutomu Amai, Tokyo; Masanobu Ogino, Yokosuka, both of Japan

[73] Assignee: Kabushiki Kaisha Toshiba, Kawasaki, Japan

[21] Appl. No.: 693,035

[22] Filed: Apr. 30, 1991

[30] Foreign Application Priority Data

Sep. 20, 1989 [JP] Japan .................. 1-244614

[51] Int. Cl.$^5$ .......................... H01L 21/324
[52] U.S. Cl. .................... 437/10; 437/247; 437/946; 148/33.2
[58] Field of Search .......... 437/10, 247, 946; 148/33, 33.2; 156/DIG. 66, DIG. 64

[56] References Cited

U.S. PATENT DOCUMENTS

| | | | |
|---|---|---|---|
| 4,344,815 | 8/1982 | Cazarra | 156/620.4 |
| 4,376,657 | 3/1983 | Nagasawa et al. | 437/10 |
| 4,432,809 | 2/1984 | Chye et al. | 437/10 |
| 4,437,922 | 3/1984 | Bischoff et al. | 437/10 |
| 4,637,123 | 1/1987 | Cazcarra et al. | 148/DIG. 60 |
| 4,661,166 | 4/1987 | Hirao | 148/DIG. 60 |
| 4,809,196 | 2/1989 | Miller | 156/601 |
| 4,851,358 | 7/1989 | Huber | 148/DIG. 24 |
| 4,862,000 | 8/1989 | Kubota et al. | 250/341 |
| 4,868,133 | 9/1989 | Huber | 437/10 |

FOREIGN PATENT DOCUMENTS 57-22417 5/1982 Japan .
58-54497 12/1983 Japan .

OTHER PUBLICATIONS

M. Hasebe, Y. Takeoka et al., "Ring-Likely Distributed Stacking Faults in CZ-Si Wafers", O Yo Butsuri; No. 10, 57 (1988), pp. 75-79.

Primary Examiner—Olik Chaudhuri
Assistant Examiner—Ourmazd S. Ojan
Attorney, Agent, or Firm—Finnegan, Henderson, Farabow, Garrett and Dunner

[57] ABSTRACT

The ratio between variations in the oxygen concentration before and after a silicon wafer is subjected to two types of heat treatments in which the temperatures and processing times are different is defined. The silicon wafer is subjected to a first heat treatment, and the interstitial oxygen concentrations before and after the first heat treatment are respectively set to $[Oi]_{1ini}$ and $[Oi]_{1af}$. The silicon wafer is successively subjected to second and third heat treatments, and the interstitial oxygen concentrations before and after the second and third heat treatments are respectively set to $[Oi]_{2ini}$ and $[Oi]_{2af}$. At this time, the interstitial oxygen concentrations $[Oi]_{1ini}$, $[Oi]_{1af}$, $[Oi]_{2ini}$ and $[Oi]_{2af}$ are so set as to satisfy the condition that $([Oi]_{2ini}-[Oi]_{2af})/([Oi]_{1ini}-[Oi]_{1af}) \geq 20$.

8 Claims, 3 Drawing Sheets

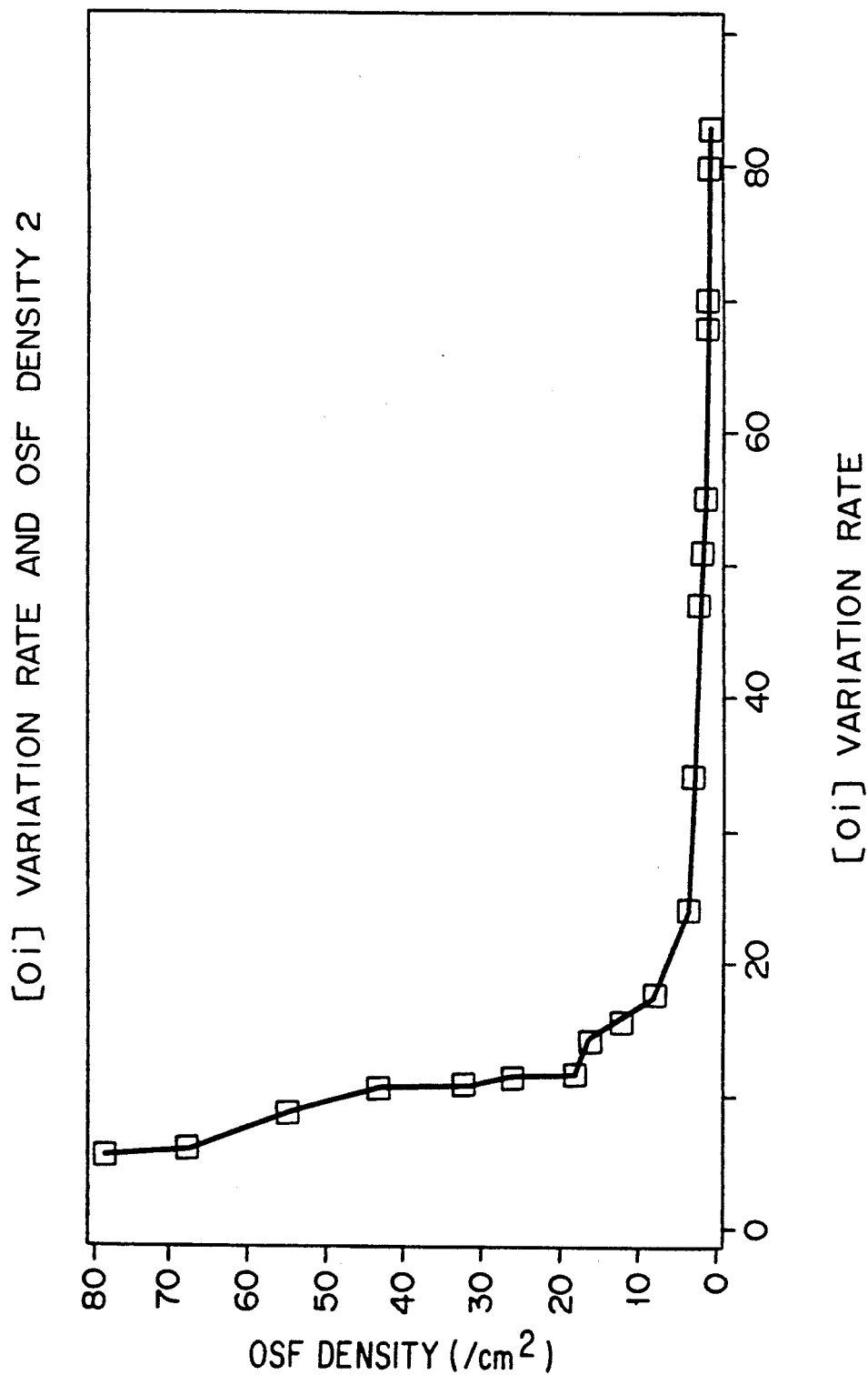
F I G. 2

SILICON WAFER WITH DEFINED INTERSTITIAL OXYGEN CONCENTRATION

This application is a continuation of application Ser. No. 07/579,667, filed Sept. 10, 1990, now abandoned.

BACKGROUND OF THE INVENTION

1. Field of the Invention

This invention relates to a silicon wafer used as a substrate for forming a semiconductor product such as a semiconductor device or a semiconductor integrated circuit device.

2. Description of the Related Art

Recently, as LSIs are formed with higher integration density and finer pattern, the requirement for the property of silicon wafers used as the substrates for forming the LSIs becomes severer. For this reason, in the pull-up stage of a silicon single crystal, the amount of impurity is reduced and the interstitial oxygen concentration is adjusted to a reasonable value, and in the processing stage, various improvements such as enhancement of flatness of the wafer are effected. As the result of this, the manufacturing yield can be enhanced to some extent.

However, even if a semiconductor device is formed by using the wafer thus improved, variation in the manufacturing yield which may be considered to be caused by the wafer itself occurs and the yield cannot be enhanced as a whole. This tendency can be frequently observed particularly when N-type wafers are used.

SUMMARY OF THE INVENTION

Accordingly, an object of this invention is to provide a silicon wafer which is used for forming a semiconductor device and which permits variation in the manufacturing yield to be reduced and causes the manufacturing yield to be enhanced as a whole when the semiconductor device is formed.

An object of this invention can be attained by a silicon wafer which is obtained by slicing a silicon single crystal ingot, comprising interstitial oxygen concentrations $[Oi]_{1ini}$ and $[Oi]_{1af}$ which are obtained before and after the silicon wafer is subjected to a first heat treatment; and interstitial oxygen concentrations $[Oi]_{2ini}$ and $[Oi]_{2af}$ which are obtained before and after the silicon wafer is successively subjected to second and third heat treatments; wherein the interstitial oxygen concentrations $[Oi]_{2ini}$, $[Oi]_{2af}$, $[Oi]_{1ini}$ and $[Oi]_{1af}$ are so set as to satisfy the condition that $([Oi]_{2ini}-[Oi]_{2af})/([Oi]_{1ini}-[Oi]_{1af}) \geq 20$.

When the silicon wafer which satisfies the above condition is used to form a semiconductor device, variation in the manufacturing yield can be reduced and a high manufacturing yield can be attained as a whole.

BRIEF DESCRIPTION OF THE DRAWINGS

FIG. 2 is a diagram showing the relation between the [Oi] variation rate of a silicon wafer and the OSF density 2.

DETAILED DESCRIPTION OF THE PREFERRED EMBODIMENT

Now, one embodiment of this invention is explained.

The inventors of this invention formed various samples and measured the interstitial oxygen concentrations on the assumption that variation in the yield considered to be caused by silicon wafers would be caused by variation in the interstitial oxygen concentration thereof. As the result of this, it was experimentally found that variation in the yield could be reduced by using silicon wafers whose interstitial oxygen concentrations were set to satisfy the condition to be described below.

Figure 1:
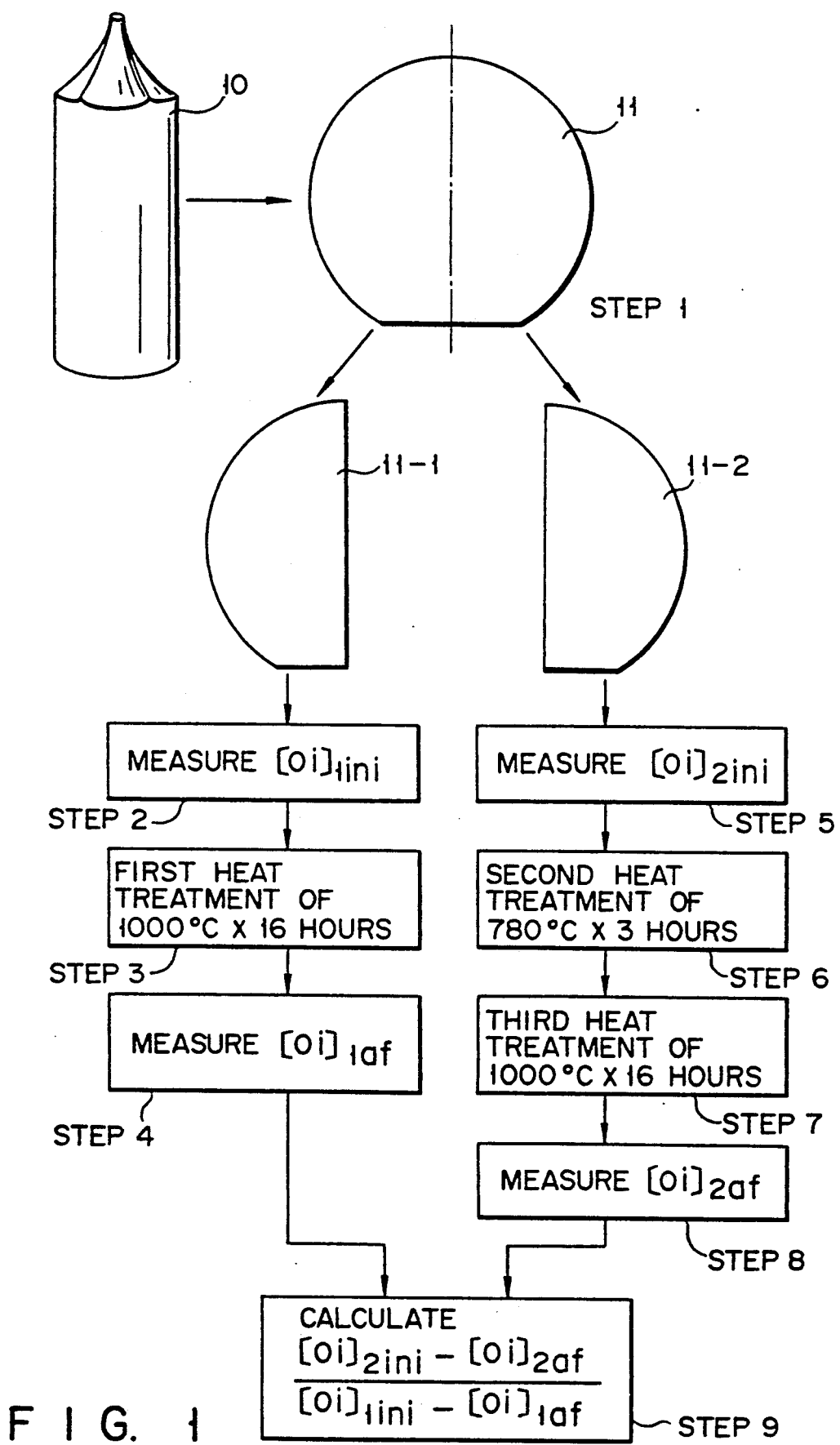
FIG. 1 is a diagram for illustrating the interstitial oxygen concentration of a silicon wafer according to an embodiment of this invention.

First, the outline of this invention is explained. FIG. 1 is a flowchart schematically showing the measurement of interstitial oxygen concentration. That is, a silicon single ingot 10 is sliced and subjected to lapping and etching processes to form silicon wafers 11 (STEP 1). Then, the silicon wafer 11 is divided into two, and the divided wafers 11-1 and 11-2 are subjected two different heat treatments. First, the first interstitial oxygen concentration $[Oi]_{1ini}$ of the wafer 11-1 which is not yet subjected to any process is measured (STEP 2). Then, it is subjected to an oxidation heat treatment (first heat treatment) in an oxygen atmosphere at temperatures of approx. 1000° C. for approx. 16 hours (STEP 3). After the oxidation heat treatment, the second interstitial oxygen concentration $[Oi]_{1af}$ is measured (STEP 4). Next, the third interstitial oxygen concentration $[Oi]_{2ini}$ of the wafer 11-2 which is not yet subjected to any process is measured (STEP 5). Then, it is subjected to an oxidation heat treatment (second heat treatment) in an oxygen atmosphere at temperatures of approx. 780° C. for approx. 3 hours (STEP 6), and subsequently it is subjected to an oxidation heat treatment (third heat treatment) in an oxygen atmosphere at temperatures of approx. 1000° C. for approx. 16 hours (STEP 7). After the oxidation heat treatment, the fourth interstitial oxygen concentration $[Oi]_{2af}$ is measured (STEP 8). A value of $([Oi]_{2ini}-[Oi]_{2af})/([Oi]_{1ini}-[Oi]_{1af})$ is derived based on the first to fourth interstitial oxygen concentrations $[Oi]_{1ini}$, $[Oi]_{1af}$, $[Oi]_{2ini}$ and $[Oi]_{2af}$, and semiconductor products such as semiconductor devices or semiconductor integrated circuit devices are formed in the silicon wafers having the derived value equal to or larger than 20.

Next, the measurements for various samples effected for determining the ratio of the above-described interstitial oxygen concentrations is explained in detail. In the pull-up stage and processing stage of a silicon single crystal, various improvements which have been effected in the prior art are made on the samples, for example, the amount of impurity of the samples is reduced, the interstitial oxygen concentration is adjusted to a reasonable value and the degree of flatness of the wafer is enhanced.

Ten silicon single crystal ingots (A to J) of N-type which are formed by the CZ method to have specific resistances of 1 to 5Ω·cm, interstitial oxygen concentrations of 14.0 to $18.0 \times 10^{17}$ atoms/cm$^3$ (in terms of the former ASTM representation) and a diameter of 5 inches and which are subjected to the above improvements were prepared. Then, each of the ingots was cut apart at two portions so as to have a width of approx. 30 cm and 20 silicon single crystal blocks (A1, A2, to J1, J2) were formed.

25 silicon wafers each having a mirror-polished surface on one side were formed from each of the above cut-apart blocks. One of the 25 silicon wafers having the mirror-polished surface is taken out as a test piece (sample) and was divided into two halves. The two test pieces were used for the following two types of Oxidation-Induced Stacking Fault (OSF) tests.

The measurement for interstitial oxygen concentration was effected as the first OSF test for one of the two divided test pieces by use of an FT-IR (Fourier transformation type infrared absorption spectrometer) (in terms of the former ASTM representation, for example, the measurement was made for one point near the center of the wafer). Next, it was subjected to an oxidation heat treatment (first heat treatment) in an oxygen atmosphere at temperatures of approx. 1000° C. for about 16 hours and then interstitial oxygen concentration after the oxidation heat treatment was measured by use of the FT-IR. In this case, the interstitial oxygen concentrations of the wafer before and after the oxidation heat treatment are respectively indicated by $[Oi]_{1ini}$ and $[Oi]_{1af}$. After the oxide film formed on the surface of the wafer was removed which was subjected to the oxidation heat treatment, the silicon wafer was subjected to wright etching to a depth of approx. 2 μm. After this, the OSF density of the silicon wafer surface was measured by using an optical microscope (hereinafter, the OSF density thus measured is referred to as "OSF density 1").

The measurement for interstitial oxygen concentration was effected as the second OSF test for the other of the two divided test pieces by use of the FT-IR. Next, it was subjected to an oxidation heat treatment (second heat treatment) in an oxygen atmosphere at temperatures of approx. 780° C. for about 3 hours and subsequently it was subjected to an oxidation heat treatment (third heat treatment) in an oxygen atmosphere at temperatures of approx. 1000° C. for about 16 hours. Then, the interstitial oxygen concentration after the second and third oxidation heat treatments was measured by use of the FT-IR. In this case, the interstitial oxygen concentrations of the wafer before and after the second and third oxidation heat treatments are respectively indicated by $[Oi]_{2ini}$ and $[Oi]_{2af}$. Further, after the oxide film formed on the surface of the wafer was removed which was subjected to the oxidation heat treatment, the silicon wafer was subjected to wright etching to a depth of approx. 2 μm. After this, the OSF density of the silicon wafer surface was measured by using an optical microscope (hereinafter, the OSF density thus measured is referred to as "OSF density 2").

Likewise, the first and second OSF tests were made with respect to the test pieces of all of the blocks (A1, A2 to J1, J2) and $[Oi]_{1ini}$, $[Oi]_{1af}$, $[Oi]_{2ini}$ and $[Oi]_{2af}$ were measured. Then, the [Oi] variation rate $([Oi]_{2ini}-[Oi]_{2af})/([Oi]_{1ini}-[Oi]_{1af})$ for each block was calculated based on the result of the measurement.

The following table-1 shows the result of the measurement and the result of calculation.

TABLE 1

| SAMPLE | $[oi]_{1ini} \times$ E17/cm$^3$ | $[oi]_{1af} \times$ E17/cm$^3$ | $[oi]_{2ini} \times$ E17/cm$^3$ | $[oi]_{2af} \times$ E17/cm$^3$ | [oi] VARIATION RATE | OSF DENSITY 1/ cm$^2$ | OSF DENSITY 2/ cm$^2$ |
|---|---|---|---|---|---|---|---|
| A1 | 17.1 | 16.8 | 17.1 | 11.8 | 17.7 | 1.1 | 7.8 |
| A2 | 16.8 | 16.5 | 16.8 | 12.1 | 15.7 | 1.3 | 12.2 |
| B1 | 17.6 | 17.5 | 17.5 | 9.5 | 80.0 | 0.1 | 0.8 |
| B2 | 17.2 | 17.1 | 17.2 | 8.9 | 83.0 | 0.2 | 0.7 |
| C1 | 16.5 | 16.1 | 16.6 | 13.1 | 8.8 | 1.4 | 54.8 |
| C2 | 16.5 | 16.1 | 16.4 | 12.1 | 10.8 | 2.1 | 43.1 |
| D1 | 15.7 | 15.6 | 15.7 | 13.3 | 24.0 | 1.1 | 3.6 |
| D2 | 15.6 | 15.5 | 15.7 | 10.6 | 51.0 | 0.8 | 1.7 |
| E1 | 16.9 | 16.6 | 16.9 | 12.6 | 14.3 | 1.7 | 15.9 |
| E2 | 16.5 | 16.1 | 16.5 | 12.1 | 11.0 | 1.3 | 32.1 |
| F1 | 15.9 | 15.8 | 15.9 | 9.1 | 68.0 | 0.5 | 1.1 |
| F2 | 15.5 | 15.4 | 15.5 | 8.5 | 70.0 | 0.3 | 1.0 |
| G1 | 16.8 | 16.7 | 16.8 | 12.1 | 47.0 | 0.7 | 1.7 |
| G2 | 16.2 | 16.1 | 16.2 | 11.1 | 51.0 | 0.6 | 1.6 |
| H1 | 17.3 | 16.9 | 17.3 | 12.7 | 11.5 | 0.9 | 25.6 |
| H2 | 16.9 | 16.6 | 16.9 | 13.4 | 11.7 | 1.7 | 17.8 |
| I1 | 17.6 | 17.5 | 17.6 | 12.1 | 55.0 | 0.8 | 1.3 |
| I2 | 17.3 | 17.2 | 17.3 | 13.9 | 34.0 | 1.1 | 2.9 |
| J1 | 15.5 | 14.9 | 15.5 | 11.8 | 6.2 | 3.1 | 67.7 |
| J2 | 15.5 | 14.9 | 15.5 | 12.1 | 5.7 | 2.1 | 78.2 |

According to the result of measurements made under the condition of the first OSF test, the OSF densities 1 take small values and it appears that the effect due to the improvements made for the silicon wafers in the silicon wafer pulling stage and processing stage may be observed. However, according to the result of measurements made under the condition of the second OSF test, it is observed that the OSF densities 2 take values in a wide range from a large value (78.2 cm$^{-2}$) to a small value (0.7 cm$^{-2}$). This means that only the first OSF test is not perfect as the silicon wafer test and there is a possibility that crystal defects such as OSF and dislocation may frequently occur in the actual manufacturing process.

FIG. 2 shows the relation between the [Oi] variation rate of the silicon wafer and the OSF density 2.

As shown in FIG. 2, the OSF density (OSF density 2) under the condition of the second OSF test can be estimated with the [Oi] variation rate (it is $+\infty$ when $[Oi]_{1ini}=[Oi]_{1af}$) used as a parameter. According to this, it is found that the OSF density 2 of the silicon wafer having the [Oi] variation rate equal to or larger than 20 is equal to or less than 5 cm$^{-2}$. The OSF density 2 rapidly increases when the [Oi] variation rate becomes smaller than 20, setting up an unwanted condition for the silicon wafer.

That is, the following fact can be understood from the results shown in the table-1 and FIG. 2.

Variation in the yield in the manufacturing process of semiconductor products can be reduced and the manufacturing yield may be enhanced as a whole by using silicon wafers having the [Oi] variation rate of 20 or more used as a parameter in the actual manufacturing process. The results of measurements for silicon wafers formed from the same block (which is a block of 30 cm width freely cut out from a silicon single crystal ingot) of the silicon single crystal ingot may be regarded as being the same as those for corresponding test pieces.

4M-bit mask ROMs (of this invention) were experimentally formed using 10 sets (No. 1 to No. 10) of silicon wafers (24 wafers except one wafer for the test piece) having the [Oi] variation rate of 20 or more. Also, 4M-bit mask ROMs (compared device) were formed using 10 sets (No. 1 to No. 10) of silicon wafers (24 wafers except one wafer for the test piece) which were determined as effective wafers according to only the first OSF test, and a difference in the yields of the devices of this invention and the compared devices was detected.

Figure 3:
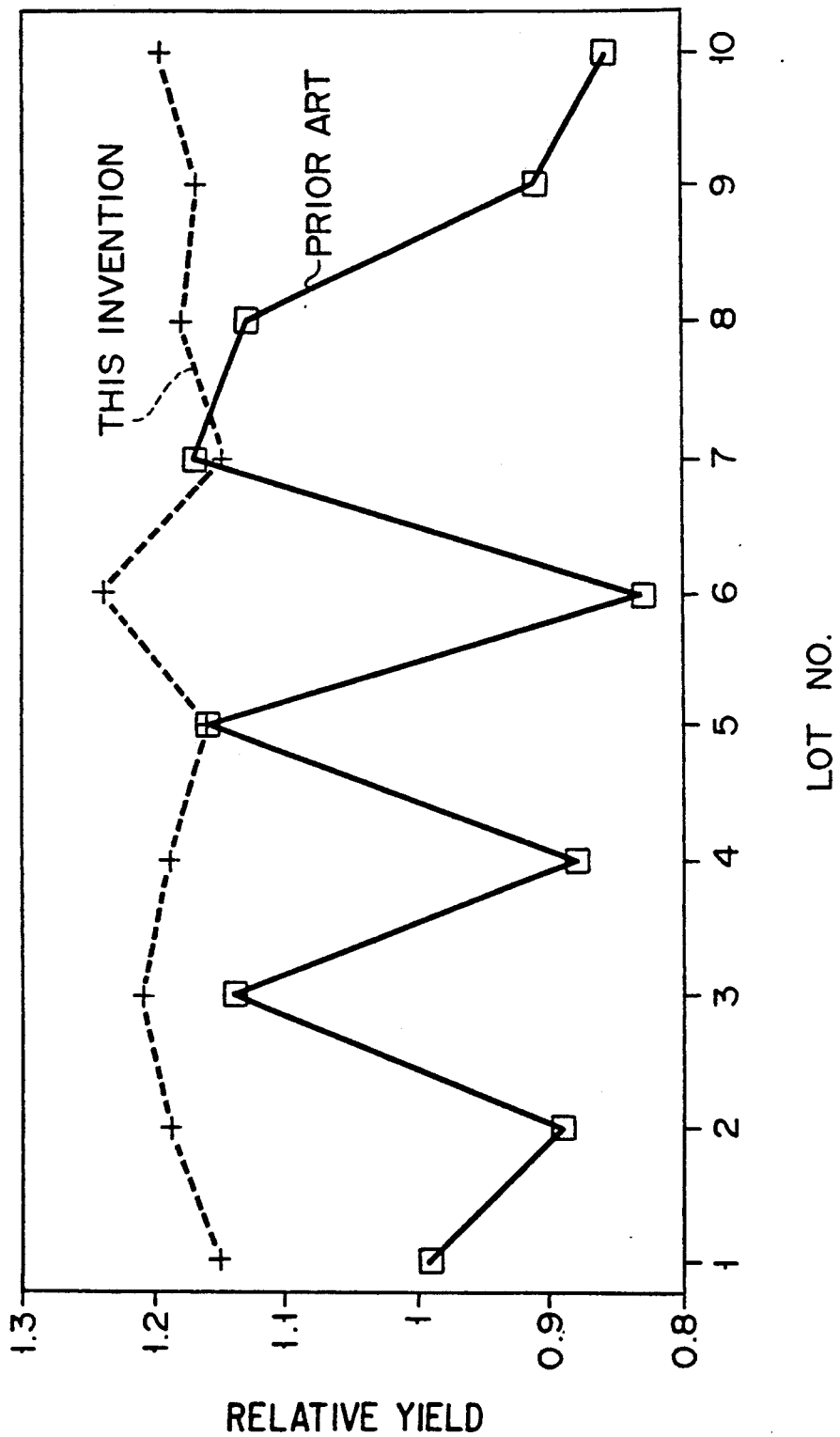
FIG. 3 is a yield comparing diagram showing the yield of devices formed by using silicon wafers according to this invention as the relative yield with respect to compared devices.

FIG. 3 is a yield comparing diagram showing the yield of devices of this invention as the relative yield with respect to the compared devices. In this case, the graduation "1" on the ordinate indicates the average yield of the compared devices.

As shown in FIG. 3, the yield of the devices of this invention has a significant effect that it is stable in the area near the maximum yield of the compared devices. In contrast, the yield of the compared devices varies greatly. Also, it can be indirectly understood that the OSF density (OSF density 2) obtained from the [Oi] variation rate can be always held at a value near the actual value.

In the above embodiment, a single silicon wafer is divided into halves to provide two test pieces in order to effect the first and second OSF tests. However, substantially the same results as those obtained in the case wherein two halves of the silicon wafer were used can be obtained when two of the silicon wafers taken out from the same block of the silicon single crystal are used as the test pieces for effecting the first and second OSF tests.

Further, the temperature in the heat treatment in the first OSF test is not limited to approx. 1000° C. but may be set within the range of 950° C. to 1100° C. Likewise, in the second OSF test, the temperature in the second heat treatment is not limited to approx. 780° C. but may be set within the range of 750° C. to 800° C., and the temperature in the third heat treatment is not limited to approx. 1000° C. but may be set within the range of 950° C. to 1100° C. The first heat treatment time in the first OSF test is preferably set in the range of 15 to 20 hours, the second heat treatment time in the second OSF test is preferably set in the range of 3 to 5 hours, and the third heat treatment time is preferably set in the range of 15 to 20 hours.

In the above explanation, the first to third heat treatments in the first and second OSF tests are effected in the oxygen atmosphere, but they can be effected in a nitrogen atmosphere containing oxygen. Further, the silicon single crystal ingot is formed by use of the CZ method (Czochralski method) but can be, of course, formed by use of the MCZ method (magneticfield-applied Czochralski method).

As described above, when the [Oi] variation rate used as the parameter becomes equal to or less than 20, the OSF density 2 rapidly increases. On the other hand, the OSF density of silicon wafers having the [Oi] variation rate of 20 or more becomes equal to or less than $5 \text{ cm}^{-2}$. Since, in this invention, silicon wafers having the [Oi] variation rate of 20 or more are used to form semiconductor devices, variation in the yield in the process of manufacturing the same can be reduced and the yield can be enhanced as a whole. The reason why such an excellent effect can be obtained is considered that the stacking fault on the silicon wafer surface can be reduced by setting the interstitial oxygen concentration within the above-described range.

What is claimed is:

1. A method of preparing a silicon wafer which is obtained by slicing a silicon single crystal ingot, comprising the steps of:

obtaining first and second test samples that have experienced a common processing with the wafer;

subjecting the first and second test samples to oxygen-induced stacking fault tests including:

measuring initial interstitial oxygen concentrations $[Oi]_{1ini}$ and $[Oi]_{2ini}$ of the first and second test samples, respectively;

heating the first sample in a first oxygen atmosphere to a first temperature to produce a modified interstitial oxygen concentration $[Oi]_{1af}$;

measuring the modified insterstitial oxygen concentration $[Oi]_{1af}$ of the first sample;

heating the second sample in second oxygen atmosphere to a second temperature to produce modified interstitial oxygen concentration;

thereafter heating the second sample in the first oxygen atmosphere to the first temperature to produce a modified interstitial oxygen concentration $[Oi]_{2af}$;

measuring the modified interstitial oxygen concentration $[Oi]_{2af}$ of the second sample;

wherein the first and second oxygen atmosphere and first and second temperatures are selected to produce a ratio $([Oi]_{2ini}-[Oi]_{2af}/[Oi]_{1ini}-[Oi]_{1af})$ exceeding a selected ratio for a reference wafer for which third and fourth test samples related thereto are obtained and subjected to tests as above, the wafer being accepted for further processing if the ratio for its related test samples exceeds that selected ratio.

2. A method of preparing a silicon wafer according to claim 1, wherein said first heating step is effected in an oxygen atmosphere at temperatures of 950° C. to 1100° C., said second heating step is effected in an oxygen atmosphere at temperatures of 750° C. to 800° C., and said third heating step is effected in an oxygen atmosphere at temperatures of 950° C. to 1100° C.

3. A method of preparing a silicon wafer according to claim 2, wherein said first heating step is effected for 15 to 20 hours, said second heating step is effected for 3 to 5 hours, and said third heating step is effected for 15 to 20 hours.

4. A method of preparing a silicon wafer according to claim 1, wherein said first heating step is effected in a nitrogen atmosphere containing oxygen at temperatures of 950° C. to 1100° C., said second heating step is effected in a nitrogen atmosphere containing oxygen at temperatures of 750° C. to 800° C., and said third heating step is effected in a nitrogen atmosphere containing oxygen at temperatures of 950° C. to 1100° C.

5. A method preparing a silicon wafer according to claim 4, wherein said first heating step is effected for 15 to 20 hours, said second heating step is effected for 3 to 5 hours, and said third heating step is effected for 15 to 20 hours.

6. A method of preparing a silicon wafer according to claim 4, wherein said first to fourth interstitial oxygen concentrations are measured by use of an FT-IR (Fourier transformation type infrared absorption spectrometer).

7. A method of preparing a silicon wafer according to claim 1, wherein said silicon single crystal ingot is formed by use of the CZ method (Czochralski method).

8. A method of preparing a silicon wafer according to claim 1, wherein said silicon single crystal ingot is formed by use of the MCZ method (magnetic-field-applied Czochralski method).

* * * * *

UNITED STATES PATENT AND TRADEMARK OFFICE
CERTIFICATE OF CORRECTION

PATENT NO. : 5,096,839
DATED : March 17, 1992
INVENTOR(S) : Tsutomu Amai et al

It is certified that error appears in the above-indentified patent and that said Letters Patent is hereby corrected as shown below:

Abstract, line 14, change ")/[" to --)/([--.

Claim 1, column 6, line 14, change "$[Oi]_{lini}$" to --$[Oi]_{lini}$--.

Claim 1, column 6, line 18, change "$[Oi]_{laf}$," to --$[Oi]_{laf}$;--.

Claim 1, column 6, line 19, change "insterstitial" to --interstitial--.

UNITED STATES PATENT AND TRADEMARK OFFICE
CERTIFICATE OF CORRECTION

PATENT NO. : 5,096,839
DATED : March 17, 1992
INVENTOR(S) : Tsutomu Amai et al

It is certified that error appears in the above-indentified patent and that said Letters Patent is hereby corrected as shown below:

Claim 1, column 6, line 20, change "$[Oi]_{1af}$" to --$[Oi]_{1af}$--.

Claim 5, column 6, line 62, after "method" insert --of--.

Insert continuation data on front page --Related U.S. Application Data [63] Continuation of Ser. No, 579,667, Sep. 10, 1990, abandoned --.

Signed and Sealed this

Twenty-eighth Day of December, 1993

Attest:

BRUCE LEHMAN

Attesting Officer        Commissioner of Patents and Trademarks